United States Patent
Hagen et al.

(10) Patent No.: US 7,634,747 B2
(45) Date of Patent: Dec. 15, 2009

(54) TRACE DELAY ERROR COMPENSATION

(75) Inventors: Michael S. Hagen, Vancouver, WA (US); Robert J. Heath, Aloha, OR (US); Glenn R. Johnson, Aloha, OR (US); Kenneth R. Marti, Portland, OR (US); James M. Fenton, Tigard, OR (US); Jonathan D. Clem, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 161 days.

(21) Appl. No.: 11/749,897

(22) Filed: May 17, 2007

(65) Prior Publication Data

US 2008/0007712 A1    Jan. 10, 2008

Related U.S. Application Data

(60) Provisional application No. 60/808,326, filed on May 24, 2006.

(51) Int. Cl.
*G06F 17/50* (2006.01)
*G06F 9/45* (2006.01)
*G01B 11/16* (2006.01)

(52) U.S. Cl. .................. 716/4; 716/6; 356/32

(58) Field of Classification Search .............. 716/4, 716/6; 356/32
See application file for complete search history.

(56) References Cited

U.S. PATENT DOCUMENTS

| 5,452,239 | A | * | 9/1995 | Dai et al. | 703/19 |
| 5,761,097 | A | * | 6/1998 | Palermo | 702/79 |
| 6,321,366 | B1 | * | 11/2001 | Tseng et al. | 716/6 |
| 2007/0168147 | A1 | * | 7/2007 | Cannon et al. | 702/117 |

* cited by examiner

*Primary Examiner*—Vuthe Siek
*Assistant Examiner*—Magid Y Dimyan
(74) *Attorney, Agent, or Firm*—Francis I. Gray; Thomas F. Lenihan

(57) ABSTRACT

A method of trace delay error compensation for measurements that are taken remotely from the signal source or receiver of a circuit uses data available from a computer aided design (CAD) tool to characterize electrical connections to an instrument measurement point, such as a connectorless probe, which is remote from the signal source or receiver. Extracted parameters from the CAD data are applied to signals acquired by the probe to adjust the signal timing and/or shape to more accurately represent the signal information timing at the signal source or receiver or other remote location of interest to a user. The corrected signals at the desired location may be displayed by a measurement instrument.

4 Claims, 1 Drawing Sheet

TRACE DELAY ERROR COMPENSATION

CROSS-REFERENCE TO RELATED APPLICATIONS

The present application claims the benefit of the filing date of U.S. Provisional Application Ser. No. 60/808,326, filed on May 24, 2006 which is hereby expressly abandoned.

BACKGROUND OF THE INVENTION

The present invention relates to accurate measurement of signals, and more particularly to the trace delay error compensation where measurements are taken from points remote from the signal source or receiver.

Signals being emitted by a source or received by a receiver generally are measured at the point of origin or point of reception, especially where timing is important at the source or receiver. In the past measurement instruments have been able to probe the signals at such points. However as circuits increase in performance, minimizing capacitive loading of the instrument probe on the circuit being tested to reduce the effect of the probe on circuit performance has become a critical product characteristic. Therefore connection adaptors and lead-sets are being eliminated, and instead connection is made directly with the circuit via connection patterns integrated directly into the circuit, commonly referred to as "connectorless probes." These connectorless probes reduce the capacitive load on the circuit being tested to less than one picoFarad.

Using a connectorless probe, however, places the point of measurement at a location that is remote from both signal sources and receivers. Further, due to the limits of signal routing on a circuit board, different time delays may be incurred by signals as they propagate between the source, receiver and connectionless probe. These various physical delays result in measurements that are less useful for verifying signal timing at the source or receiver. Also the signals may be distorted along the propagation paths so an accurate analog representation of the signal at the source or receiver also is compromised. Such distortions result in a time shift of the information carried by the signal, further affecting the verification of signal timing at the source or receiver.

Therefore what is desired is a method of trace delay compensation that restores the timing of information carried by signals as they occur at a source or receiver when measured at a remote location.

BRIEF SUMMARY OF THE INVENTION

Accordingly the present invention provides a method of trace delay compensation for measurements that are taken remotely from the signal source or receiver of a circuit. Data available from a computer aided design (CAD) tool is used to characterize electrical connections to a measurement point of the circuit, such as a connectorless probe, which is remote from the signal source or receiver. Extracted parameters from the CAD data are applied to signals acquired by the probe to adjust the signal timing and shape to more accurately represent the information timing carried by the signal at the signal source or receiver or other remote location of interest to a user. The corrected signals at the desired location may be displayed by a measurement instrument.

The objects, advantages and other novel features of the present invention are apparent from the following detailed description when read in conjunction with the appended claims and attached drawing.

DETAILED DESCRIPTION OF THE INVENTION

Figure 1:
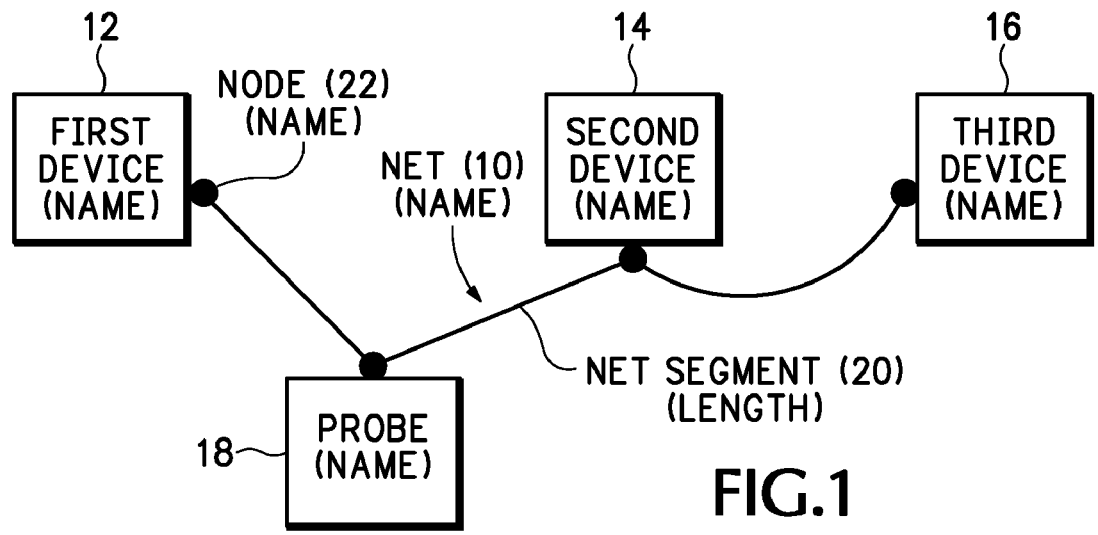
FIG. 1 is simple diagram view of a hardware net used to illustrate the present invention.

During a schematic design process for a circuit, a user includes measurement points, such as a connectorless probe, in the schematic. Signals to be measured to assure that the operation of the circuit are coupled to the measurement points or connectorless probe pins. The connectorless probe is assigned an instance name, with each of the signals connected to the pins being assigned a net name. During the schematic design process, a netlist is used by a computer aided design (CAD) tool to produce a physical layout for the circuit board. The circuit board physical layout includes a trace length file that describes the order of node connections for each node in the net and a net segment length between each node. The design netlist and the trace length files provide data that is used for trace delay compensation, as described below, which data may be loaded into a measurement instrument, such as a logic analyzer. Other data may include information about trace impedance that may distort the signal shape when propagating along the traces, which affects the timing of information carried by the signals.

The measurement instrument captures the signals from the connectorless probe in a normal manner. When displaying the acquired signals the user selects a location to be observed for each acquired signal, such as at a signal source or receiver. The observed location may be the acquisition location, a circuit node or a circuit device (implied node). The user may observe the location of the device driving the signal, i.e., the signal source, to measure drive skew, or the location of the device receiving the signal, i.e., the signal receiver, to measure received signal skew or the time relationship between the received signal and strobe signals. The algorithm used produces a time transformation from the acquisition location to any location of interest in the circuit being tested. The algorithm also may adjust the signal shape to compensate for any signal distortion along the propagation path between the acquisition point and the observed location which affects timing of the information carried by the signal.

The netlist has net names for all signals captured by the measurement instrument as well as the device instance names associated with the signals. The selection of the observation location is presented to the user in a list form using the same names as those entered into the CAD tool. When there are multiple sources and receivers, the user may be required to identify both the specific source and receiver to assure a correct time delay calculation, i.e., to provide compensation for the direction of signal propagation. The algorithm also may provide to the user adjustments for propagation characteristics of the particular circuit board and node termination delays.

Alternatively the parameters extracted from the CAD tool data may be used to alter acquisition parameters. The measurement instrument may provide the ability to insert time delays in series with each input signal. This produces a similar time and shape transformation as described above. However in this case the realtime acquisition functions, such as setup and hold violation, capture and trigger functions, may also be affected. The limitation of this alternative approach is that only one location of transformation is targeted for each acquisition record and the range of time adjustment is limited by the hardware implementation.

Preferably the transformation parameters are extracted from the CAD database in an automated fashion using a software application. However these parameters also may be supplied via manual entry or other automated means.

Figure 2:
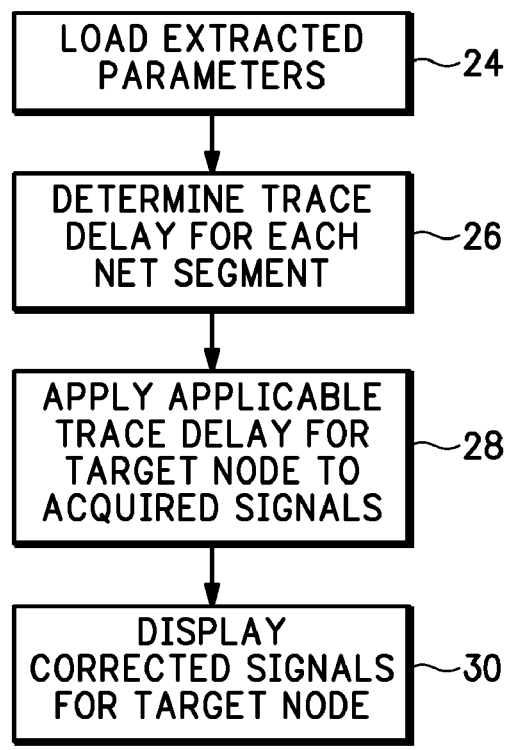
FIG. 2 is a flow diagram view of a method of trace delay error compensation according to the present invention.

Referring now to FIG. 1 a hardware net 10 is connected to three components 12, 14, 16. In this example a connectorless probe 18 is inserted into the net 10 between two of the components 12, 14. The net 10 is composed of net segments 20 that connect nodes 22 for the different components 12, 14, 16, 18 to each other. Each net segment 20 has a specified length and the circuit board has a characteristic signal propagation velocity and impedance along each net segment 20. As shown in FIG. 2 the parameters extracted from the CAD tool data are loaded into the measurement instrument(24). In its simplest form the algorithm used by the measurement instrument divides the segment length for each net segment 20 by the propagation velocity to produce the segment time delay or trace delay for each net segment(26). If the signal source 12, 14, 16 is known, then a time difference between any node 22 and the probe node may be calculated by the measurement instrument(28). The time difference is used to produce a transform that may be applied either to the acquisition system or to process unadjusted acquisitions. The transformed result is displayed by the measurement instrument to represent the signals as if they were captured at the observed location or target node 22 (30).

Likewise the shape of the signal at the observed location or target node 22 may be transformed from the acquired signal shape using the known segment length and propagation path impedance using a more sophisticated form of the algorithm. As a result the signals captured remotely from the target node 22 may be displayed in a more accurate timing relationship with each other.

Thus the present invention provides trace delay error compensation in both time and shape for signals captured remotely from a target node to more accurately represent such signals at the target node by loading parameters extracted from a CAD tool used to design the circuit into a measurement instrument, and then using the extracted parameters to adjust timing and signal shape at the target node.

What is claimed is:

1. A method of trace delay error compensation for use in a test and measurement instrument, comprising the steps of:
   loading parameters from a design tool used to create a circuit under test into a measurement instrument;
   acquiring signals from the circuit under test using the measurement instrument at an acquisition location on the circuit under test that is remote from a target circuit location on the circuit under test; and
   correcting in the test and measurement instrument the acquired signals using the parameters so that the signals are adjusted to represent the signals at the target circuit location;
   displaying the adjusted signals by the test and measurement instrument to show a correct timing relationship between the signals at the target circuit location;
   wherein the correcting step comprises the steps of:
   computing an associated time delay between the acquisition location and the target circuit location, based upon a segment path length and propagation velocity as the parameters, for each of the acquired signals; and
   adjusting the acquired signals in time according to the associated time delay to compensate for propagation delay between the acquisition location and the target circuit location;
   determining from the parameters a distortion effect for each segment path length upon the acquired signals; and
   refining the associated time delay to compensate for the distortion effect on each of the acquired signals.

2. The method as recited in claim 1 wherein the design tool comprises a computer aided design (CAD) tool.

3. The method as recited in claim 2 wherein the loading step comprises the step of automatically loading a design netlist and trace length files from the CAD tool as the parameters into the measurement instrument.

4. The method as recited in claim 2 wherein the loading step comprises the step of manually loading a design netlist and trace length files from the CAD tool as the parameters into the measurement instrument.

* * * * *